(12) United States Patent
Chen et al.

(10) Patent No.: US 7,626,270 B2
(45) Date of Patent: Dec. 1, 2009

(54) CORELESS PACKAGE SUBSTRATE WITH CONDUCTIVE STRUCTURES

(75) Inventors: Bo-Wei Chen, Hsinchu (TW); Hsien-Shou Wang, Hsinchu (TW); Shih-Ping Hsu, Hsinchu (TW)

(73) Assignee: Phoenix Precision Technology Corporation, Hsinchu (TW)

( * ) Notice: Subject to any disclaimer, the term of this patent is extended or adjusted under 35 U.S.C. 154(b) by 191 days.

(21) Appl. No.: 11/583,082

(22) Filed: Oct. 19, 2006

(65) Prior Publication Data
US 2007/0246744 A1   Oct. 25, 2007

(51) Int. Cl.
*H01L 23/48* (2006.01)
*H05K 7/00* (2006.01)
*H05K 1/03* (2006.01)

(52) U.S. Cl. .............. 257/774; 257/775; 257/786; 257/E23.011; 257/E23.145; 361/748; 361/777; 174/262; 174/263

(58) Field of Classification Search ............. None
See application file for complete search history.

(56) References Cited

U.S. PATENT DOCUMENTS

| | | | |
|---|---|---|---|
| 2004/0150112 A1* | 8/2004 | Oda ............................ | 257/758 |
| 2004/0159951 A1* | 8/2004 | Toyoda et al. ............... | 257/762 |
| 2006/0121719 A1* | 6/2006 | Nakamura et al. .......... | 438/613 |
| 2006/0223236 A1* | 10/2006 | Nomura et al. ............. | 438/121 |

* cited by examiner

*Primary Examiner*—Alonzo Chambliss
(74) *Attorney, Agent, or Firm*—Bacon & Thomas, PLLC

(57) ABSTRACT

A method of manufacturing a coreless package substrate together with a conductive structure of the substrate is disclosed. The method can produce a coreless package substrate which comprises: at least a built-up structure having a first solder mask and a second solder mask, wherein a plurality of openings are formed in the first and second solder mask to expose the conductive pads of the built-up structure; and a plurality of solder bumps as well as solder layers formed on the conductive pads. Therefore, the invention can produce the coreless package substrate with high density of circuit layout, less manufacturing steps, and small size.

6 Claims, 6 Drawing Sheets

CORELESS PACKAGE SUBSTRATE WITH CONDUCTIVE STRUCTURES

BACKGROUND OF THE INVENTION

1. Field of the Invention

The present invention relates to a method of manufacturing a core-less package substrate, and more particularly, to a method of manufacturing a coreless substrate that is applicable to non-through hole structures, together with a conductive structure of the substrate, so as to increase integration, and simplify manufacture process.

2. Description of Prior Arts

With rigorous development of the electronic industry, the directions of the research in electronic products are turning to high integration and miniaturization to meet the needs for multi-function, high speed, and high frequency. Accordingly, the circuit board for connecting a plurality of active and passive components to circuits is evolving from single layer to multi-layers in order to expand spaces of circuit layout to thereby meet the requirements of high wiring density for integrated circuits.

The conventional processes of electronic devices begin first by providing chip carriers suitable to semiconductor chips, such as substrates or lead frames, then the chip carriers are forwarded to semiconductor packaging industry to proceed with the processes of chip disposing, molding, and ball mounting, etc.; finally, electronic devices having requested functions are produced.

A conventional semiconductor packaging structure is made such that a semiconductor chip is mounted on the top surface of the substrate, and then wire bonding or flip-chip packaging are performed, followed by placing solder balls on the back of the substrate to suffice electrical connections for a printed circuit board. Though high-number leads are achieved in this way, usage on higher frequency and operations at higher speed are restricted due to limited performance of the package structure attributed to lacks of both shorter paths of leads and higher wiring density.

In the method of manufacturing a package substrate, the whole steps of a conventional technique start from providing a core substrate, then drilling, plating, hole-plugging, circuit-forming to thereby accomplish an inner layer structure, and further carrying out a build-up process to obtain a multi-layer carrier substrate. FIGS. 1A to 1E are schematic illustrations of a t prior art. Referring to FIG. 1A about a core substrate 11, a core layer 111 of predetermined thickness has circuit layers 112 formed on the surface thereof. Meanwhile, a plurality of plating through holes 113 are formed in the core layer 111, such that the circuit layers 112 are electrically connected. Subsequently, as shown in FIG. 1B, the core substrate 11 is treated by a build-up process. First, a dielectric layer 12 is formed on the surface of the core substrate 11 with a plurality of openings 13 corresponding to the circuit layers 112. Then, as shown in FIG. 1C, a seed layer 14 as a conductor is formed on the surface of the dielectric layer 12 by electroless plating or sputtering, and a patterned resistive layer 15 is formed on the seed layer 14, having a plurality of open areas 150 therein to thereby expose the parts of the seed layer 14. Subsequently as shown in FIG. 1D, a patterned circuit layer 16 and a plurality of conductive vias 13a are formed in the open areas 150 of the resistive layer 15 by electroplating through the seed layer 14, such that patterned circuit layer 16 is electrically connected to circuit layer 112 through the conductive vias 13a; then the resistive layer 15 is removed and etching is carried out, thereby removing the seed layer 14 covered underneath the resistive layer 15, such that the first built-up structure 10a is formed. Finally, as shown in FIG. 1E, likewise, a second built-up structure 10b is formed on the first built-up structure 10a by the same process, and built-up layers are formed repetitively to thereby obtain a multi-layer substrate.

However, in the process described above, a core substrate is formed by forming circuits on a core layer, followed by a build-up process on the core substrate, thereby forming a multi-layer substrate that complies with the required electrical design. As a result, the thickness of the final multi-layer substrate cannot be reduced, which is unfavorable to the developmental trend of a miniaturized semiconductor package structure. If the thickness of the core substrate is reduced to as thin as 60 μm or less, the manufacture of the multi-layer substrate will be seriously compromised, and the yield from the manufacture of substrates will decrease significantly.

In addition, there are extra steps in the manufacture of the core substrate, such as the hole-plugging and the scrubbing, which increase the manufacture cost. More importantly, it is necessary to form a plurality of plating through holes in the core substrate; the diameter of a typical through hole formed by drilling is approximately 100 μm or more, while the diameter of the conductive via (laser blind hole) is approximately 50 μm. In comparison, the process of plating through holes makes it more difficult to form a structure with finer circuits.

Moreover, in the process of the multi-layer substrate described above, it is necessary to fabricate a core substrate prior to forming dielectric layers and circuit layers, which consequently complicates the manufacture steps, prolongs the process, and increases the manufacture cost.

As a result, the industry urgently needs a solution to avoid the drawbacks of the previous technique, such as the increased thickness of a substrate, low wiring density, low yield, complicated manufacture steps, a lengthy process, and a high manufacture cost.

SUMMARY OF THE INVENTION

In light of the shortcomings of the prior arts described above, the primary objective of the present invention is to provide a method of manufacturing a package substrate and to provide a conductive structure of the substrate, so as to raise the wiring density and reduce the thickness of substrate, and thereby meet the developmental trend toward miniaturization.

Another objective of the present invention is to simplify manufacture steps, raise yield, shorten manufacture time, and reduce manufacture cost.

To achieve the above and other objectives, the present invention discloses a method of manufacturing a package substrate, which includes:

(A) providing a carrier board, and forming a first resistive layer on the top surface of the carrier board, wherein a plurality of first openings are formed in the first resistive layer to expose parts of the substrate;

(B) forming in turn an etching-stop layer and a first metal layer in each of the first openings, and then removing the first resistive layer;

(C) forming a dielectric layer on the surface of the carrier board and on the first metal layers, wherein a plurality of second openings are formed in the dielectric layer to expose parts of the top surfaces of the first metal layers, and then forming a second metal layer in each of the second openings;

(D) forming a second resistive layer on the dielectric layer and on the second metal layers, wherein a plurality of third openings are formed in the second resistive layer at the positions corresponding to the second metal layers, and then forming a third metal layer in each of the third openings, followed by removing the second resistive layer;

(E) forming a built-up structure on the dielectric layer and on the third metal layers, which includes at least a dielectric layer, at least a fourth metal layer of patterned circuit, a plurality of conductive vias, as well as a plurality of conductive pads;

(F) removing the carrier board and the etching-stop layer to thereby expose the bottom surfaces of the first metal layers; and (G) forming a first solder mask on the built-up structure, wherein a plurality of fourth openings are formed in the first solder mask to expose parts of the built-up structure as electrical connecting pads, and forming a second solder mask on the dielectric layer and on the bottom surfaces of the first metal layers, wherein a plurality of fifth openings are formed in the second solder mask to expose parts of the bottom surfaces of the first metal layers.

Thereby, the coreless package substrate prepared by the present invention has higher circuit layout density, fewer manufacturing steps, reduced general thickness of the products, and a small size.

The method of manufacturing the coreless package substrate can further comprise a step (H) after step (G), forming a plurality of solder bumps in the fourth openings of the first solder mask and forming a plurality of solder layers in the fifth openings of the second solder mask.

In addition, the method of the present invention can further comprise a step (I) after forming solder bumps and solder layer in step (H): attaching at least a metal supporting frame on the surface of the first solder mask, so as to increase general rigidity of the coreless package substrate.

Besides, the method of the present invention can further comprise a step (G1) before forming the solder bumps in the fourth openings and forming the solder layers in the fifth openings: forming a filling metal layer as a post in at least one of the fourth openings in the first solder mask and the fifth openings in the second solder mask, to thereby reduce the quantity of solder material needed for the solder layers as well as the solder bumps.

The build-up process to form a built-up structure in step (E) is well known in the art, wherein a multi-layer built-up structure can be obtained by repeating the build-up process; thus the details are not described further here.

In addition, this invention also disclose a conductive structure of a coreless package substrate, comprising: a dielectric layer having a plurality of first openings and second openings therein, outward to the opposing sides of the dielectric layer, wherein the second openings correspond to and are smaller than the first openings each; a first metal layer formed in each of the first openings as a conductive pad, wherein the thickness of the first metal layer is smaller than the depth of the first opening, therewith the first metal layer contacting the second opening; and a second metal layer formed in each of the second openings as a conductive via, filling up the second opening and contacting the first metal layer in the first opening.

Besides, the above structure comprises a solder mask formed on the dielectric layer and the first metal layer, having a plurality of openings formed therein, wherein the openings of the solder mask correspond to and are smaller than the first openings each.

Furthermore, the above structure comprises a solder layer formed in each of the openings of the solder mask.

Moreover, the above structure can comprise a metal layer formed in each of the openings of the solder mask as a post before forming the solder layer, to thereby reduce the quantity of solder material needed for the solder layer.

Other objects, advantages, and features of the invention will become more apparent from the following detailed description when taken in conjunction with the accompanying drawings.

DETAILED DESCRIPTION OF THE PREFERRED EMBODIMENT

Figure 1A:
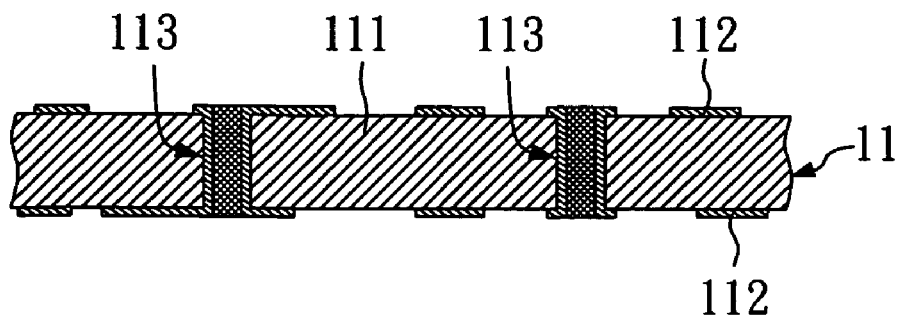
FIGS. 1A to 1E are cross-sections of the process to make a conventional core package substrate.
Figure 1B:
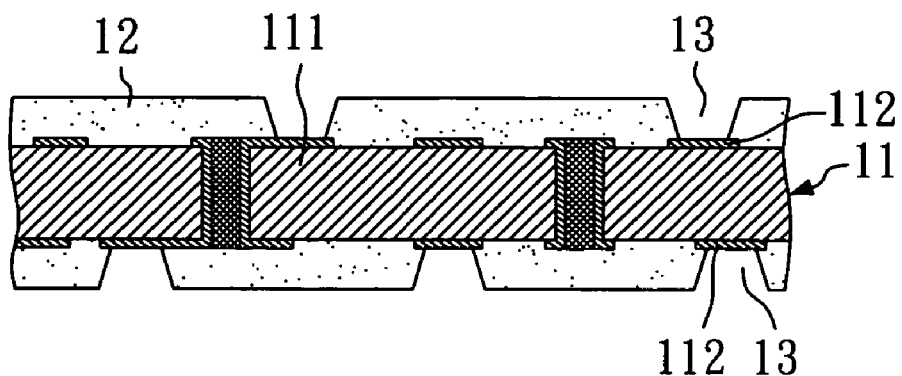
Figure 1C:
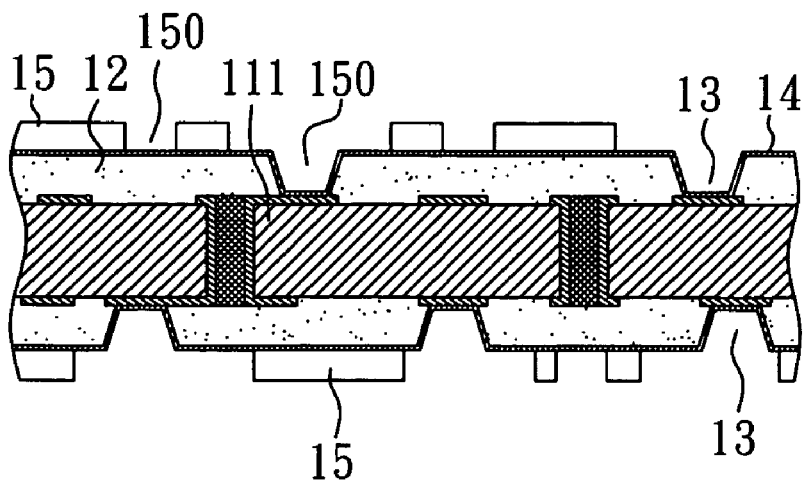
Figure 1D:
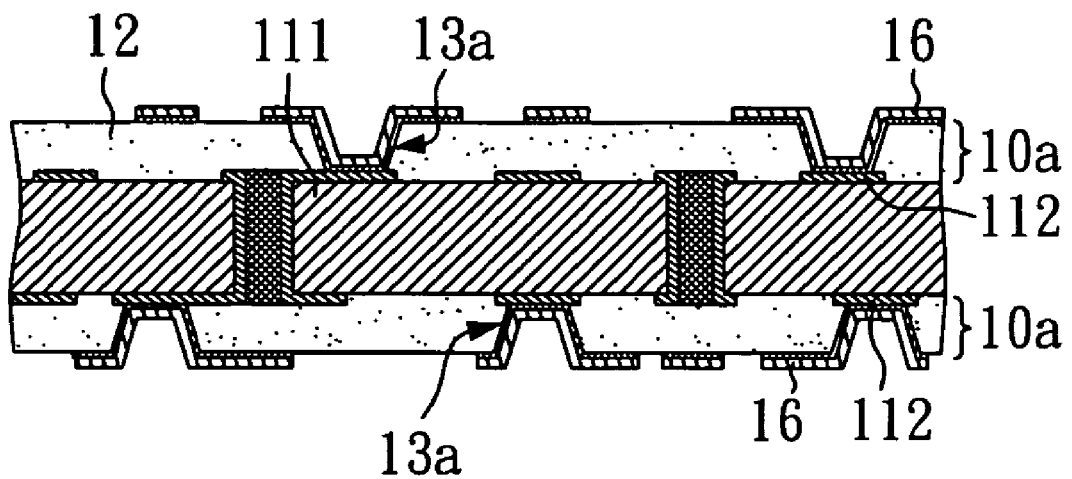
Figure 1E:
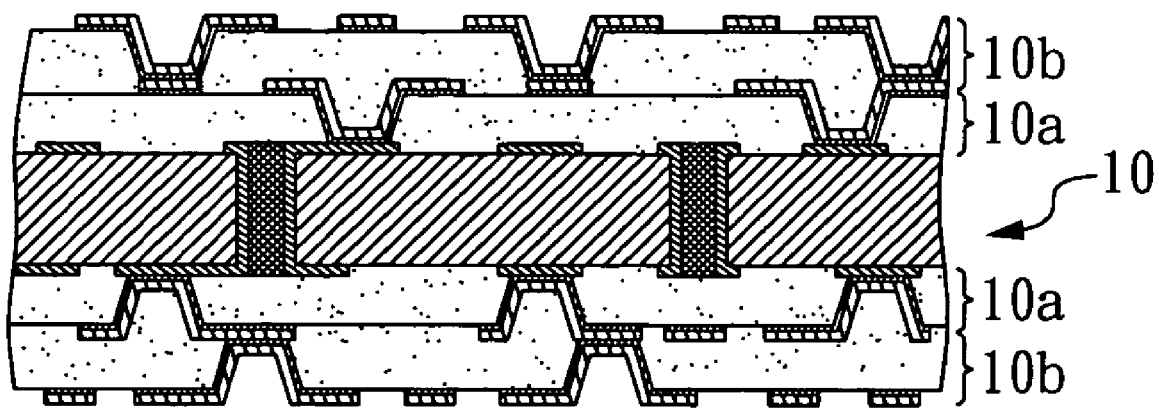
Figure 2A:
FIGS. 2A to 2Q are cross-sections of a coreless package substrate of a preferred embodiment of the present invention.
Figure 2B:
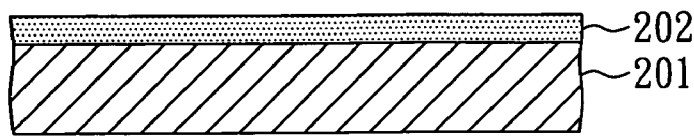
Figure 2C:
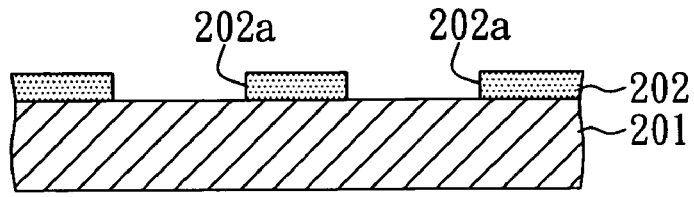
Figure 2D:
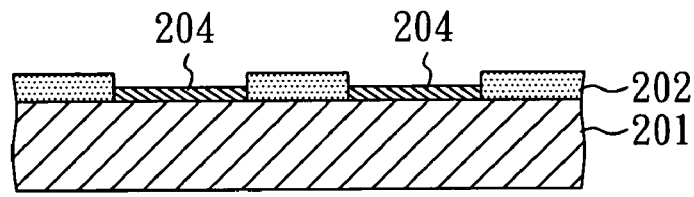
Figure 2E:
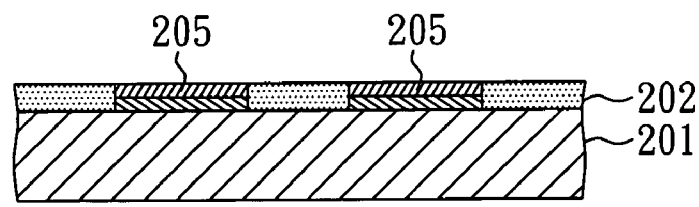
Figure 2F:
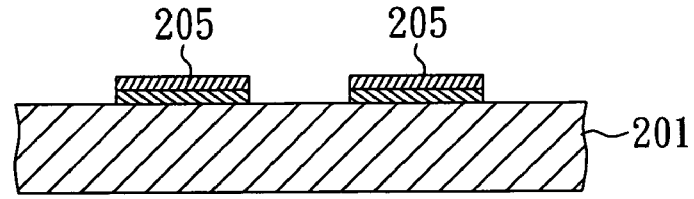
Figure 2G:
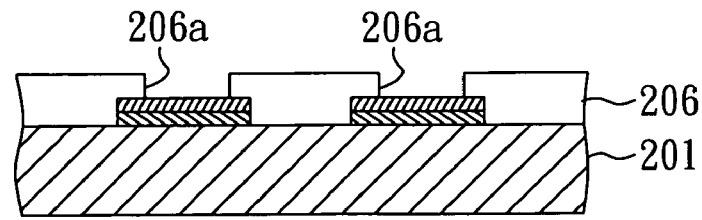
Figure 2H:
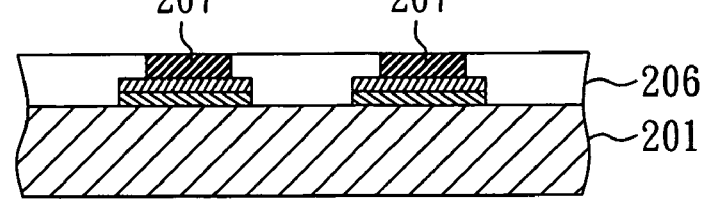
Figure 2I:
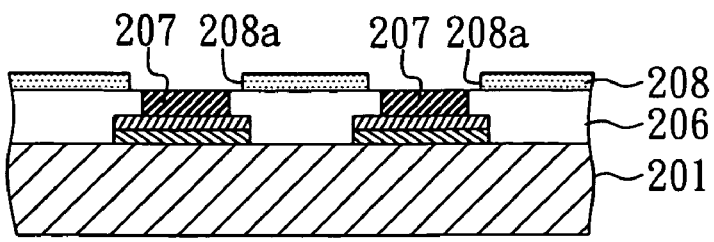
Figure 2J:
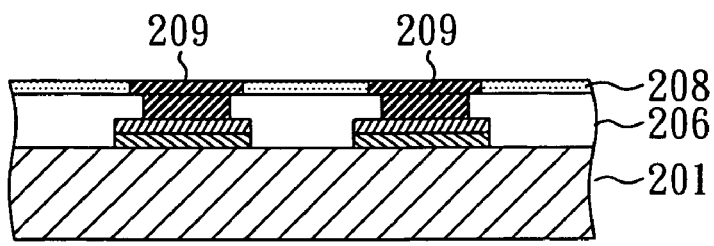
Figure 2K:
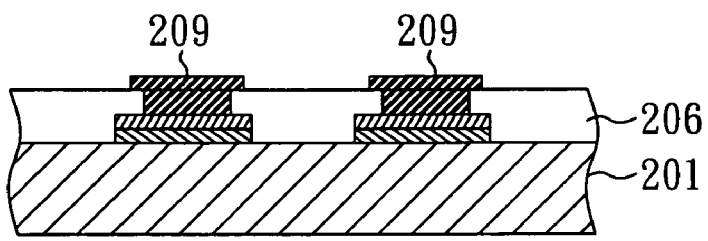
Figure 2L:
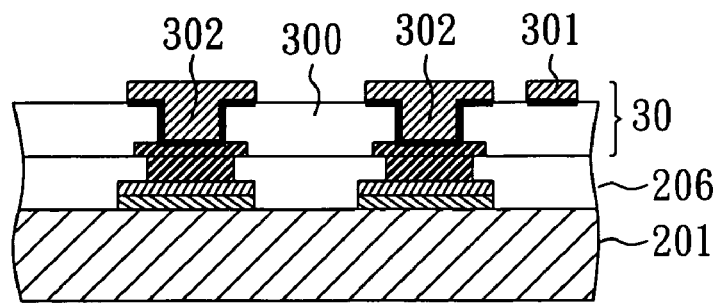
Figure 2M:
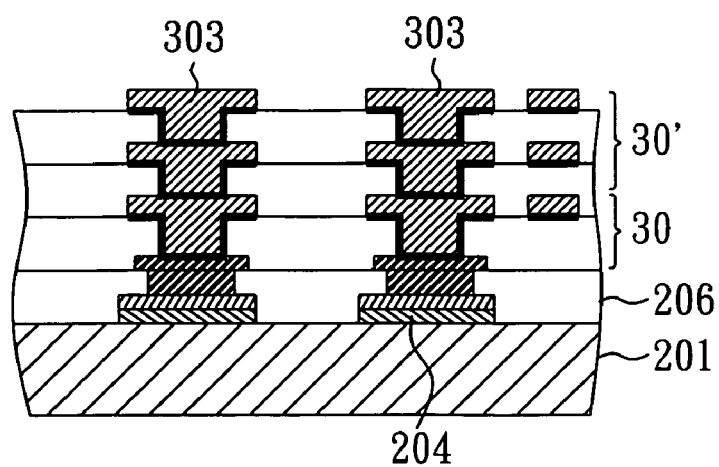
Figure 2N:
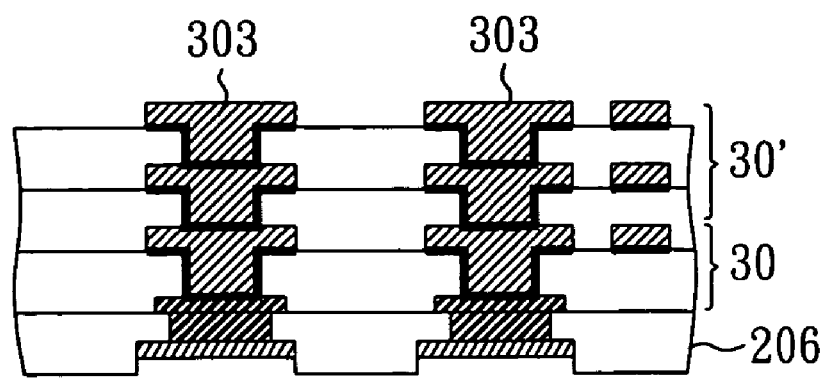
Figure 2O:
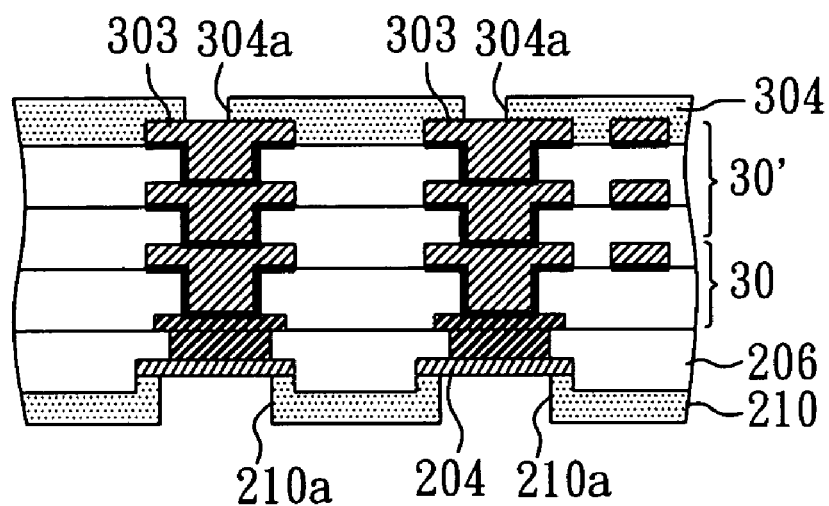
Figure 2P:
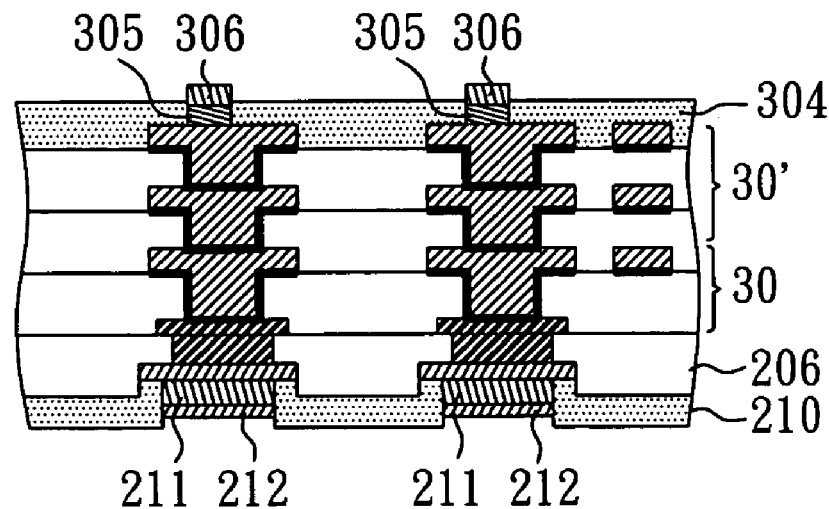
Figure 2Q:
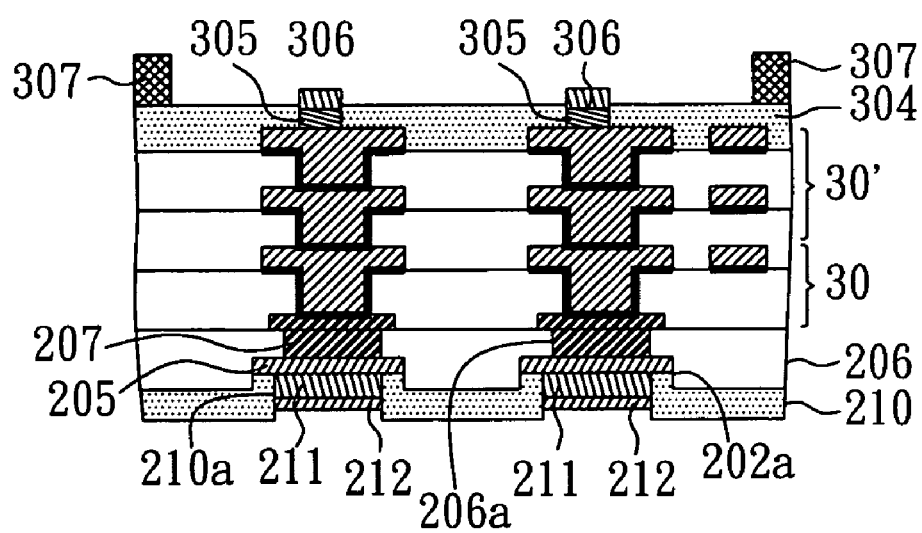

FIGS. 2A to 2Q are schematic cross-section illustrations of a coreless package substrate of a preferred embodiment of the present invention. First, as shown in FIG. 2A, a metal carrier board 201 is provided. Then, as shown in FIG. 2B, a first resistive layer 202 is formed on the carrier board 201. As shown in FIG. 2C, a plurality of first openings 202a are formed in the first resistive layer to expose parts of the carrier board 201 underneath. Subsequently, as shown in FIGS. 2D and 2E, an etching-stop layer 204 and a first metal layer 205 are in turn formed in the first openings 202a. In this example, the first resistive layer 202 is a dry-film photoresistive layer.

Referring to FIG. 2F, the first resistive layer 202 is removed. As shown in FIG. 2G, a dielectric layer 206 made of ABF (Ajinomoto Build-up Film) is formed on the surfaces of the carrier board 201 and the first metal layer 205, wherein a plurality of openings 206a is formed by laser ablation in the dielectric layer 206 to expose parts of the first metal layer 205 underneath. Subsequently, as shown in FIG. 2H, a second metal layer 207 is formed in the second openings 206a. As illustrated in FIG. 2I, a second resistive layer 208 is formed on the surfaces of the dielectric layer 206 and the second metal layer 207, wherein a plurality of third openings 208a are formed in the second resistive layer 208 by photolithography, so as to expose the second metal layer 207 underneath. As shown in FIG. 2J, a third metal layer 209 is formed on the third openings 208a. Then, as shown in FIG. 2K, the second resistive layer 208 is removed by photolithography.

Subsequently, as shown in FIG. 2L, a built-up structure 30 is formed on the dielectric layer 206 and the third metal layer 209, which includes a dielectric layer 300, a fourth metal layer 301 of patterned circuit, and a plurality of conductive vias 302. Because the process of forming the built-up structure 30 is well known in the art, the details are not described further here.

Further referring to FIG. 2M, another two built-up structures 30' are formed on the built-up structure 30, which includes a plurality of conductive pads 303. As shown in FIG. 2N, the carrier board 201 and the etching-stop layers 204 are removed by etching. Then, as shown in FIG. 2O, a first solder mask 304 for insulating protection is coated on surface of the built-up structure 30', and a plurality of fourth openings 304 are formed on the first solder mask 304 by photolithography, so as to expose the conductive pads 303 of the built-up structure 30'. A second solder mask 210 for insulating protection is formed on the surface of the dielectric layer 206, and a plurality of fifth openings 210a are formed in the second solder mask 210 by photolithography, so as to expose parts of the surfaces of the first metal layers 205.

Referring to FIG. 2P, a filling metal layer 305 and 211 can be formed in each of the fourth openings 304a of the first solder mask 304, and the filling metal layer 305 and 211 can also be formed in each of the fifth openings 210a of the second solder mask 210. In this embodiment, the solder bumps 306 and the solder layers 212 are formed on the surfaces of the filling metal layers 305 and 211 in each of the fourth openings 304a, as well as in each of the fifth openings 210a, wherein the filling metal layers 305 and 211 serves as a post to thereby reduce the quantity of solder material needed for the solder layers 212 as well as the solder bumps 306. Finally, as shown in FIG. 2Q, a metal supporting frame 307 is attached on the surface of the first solder mask 304, thereby increasing the general rigidity of the coreless package substrate.

In the embodiment above, the method of forming the first openings 202a in the first resistive layer 202 in FIG. 2C as well as that of forming the third openings 208a in the second resistive layer 208 in FIG. 2I, both the fourth openings 304a in the first solder mask 304 and the fifth openings 210a in the second solder mask 210 in FIG. 2O is photolithography, while the method of forming the second openings 206a in the dielectric layer 206 in FIG. 2G is laser ablation.

In the embodiment above, the method of forming the etching-stop layers 204 in FIG. 2D, as well as that of forming the first metal layers 205 in FIG. 2E, the second metal layers 207 in FIG. 2H, the third metal layers 209 in FIG. 2J, and the fourth metal layers 301 together with the conductive vias 302 in FIG. 2L can be either electroplating or electroless plating.

In the embodiment above, the etching-stop layer 204 as well as the solder bump 306 and the solder layer 212 can be selected from one of gold, silver, tin, nickel, chromium, titanium, lead, copper, aluminum, and an alloy of a combination of the above metals, while the first metal layer 205, as well as the second metal layer 207, the third metal layer 209, the fourth metal layer 301 together with the conductive vias 302, and the filling metal layers 305 and 211 can be selected from one of copper, aluminum, tin, nickel, chromium, and an alloy of a combination of the above metals.

The present invention also disclose a conductive structure of the substrate, as shown in FIG. 2Q, comprising: a dielectric layer 206 having a plurality of first openings 202a and second openings 206a therein, outward to the opposing sides of the dielectric layer 206, wherein the second openings 206a correspond to and are smaller than the first openings 202a each; a first metal layer 205 formed in each of the first openings 202a as a conductive pad, wherein the thickness of the first metal layer 205 is smaller than the depth of the first opening 202a, therewith the first metal layer 205 contacting the second opening 206a; and a second metal layer 207 formed in each of the second openings 206a as a conductive via, filling up the second opening 206a and contacting the first metal layer 205 in the first opening 202a.

Besides, the above structure comprises a solder mask 210 formed on the dielectric layer 206 and the first metal layer 205, having a plurality of openings 210a formed therein, wherein the openings 210a of the solder mask 210 correspond to and are smaller than the first openings 202a each.

Furthermore, the above structure comprises a solder layer 212 formed in each of the openings 210a of the solder mask 210.

Moreover, the above structure can comprise a metal layer 211 formed in each of the openings 210a of the solder mask 210 as a post before forming the solder layer 212, to thereby reduce the quantity of solder material needed for the solder layer 212.

Thus, the coreless package substrate of the example can increase circuit layout density, simplify process of manufacture, and reduce general thickness of the products, so as to achieve small sizes.

Although the present invention has been explained in relation to its preferred embodiment, it is to be understood that many other possible modifications and variations can be made without departing from the scope of the invention as hereinafter claimed.

What is claimed is:

1. A conductive structure of a coreless package substrate, comprising:
   a dielectric layer having a plurality of first openings and second openings therein, outward to the opposing sides of the dielectric layer, wherein the second openings correspond to and are smaller than the first openings each;
   a first metal layer formed in each of the first openings as a conductive pad, wherein the thickness of the first metal layer is smaller than the depth of the first opening, therewith the first metal layer contacting the second opening;
   a second metal layer formed in each of the second openings as a conductive via, filling up the second opening and contacting the first metal layer in the first opening; and
   a solder mask formed on the dielectric layer and the first metal layer, having a plurality of openings formed therein, wherein the openings of the solder mask correspond to and are smaller than the first openings each.

2. The structure of claim 1, further comprising a solder layer formed in each of the openings of the solder mask.

3. The structure of claim 2, further comprising a filling metal layer formed in each of the openings of the solder mask as a post before forming the solder layer, to thereby reduce the quantity of solder material needed for the solder layer.

4. The structure of claim 3, wherein the filling metal is selected from one of copper, aluminum, tin, nickel, chromium, and an alloy of a combination of the above metals.

5. The structure of claim 2, wherein the solder layer is selected from one of tin, gold, nickel, chromium, titanium, silver, copper, aluminum, lead, and an alloy of a combination of the above metals.

6. The structure of claim 1 wherein the first metal layer as well as the second metal layer is selected from one of copper, aluminum, tin, nickel, chromium, and an alloy of a combination of the above metals.

* * * * *